US009082588B2

(12) United States Patent
Matsumoto

(10) Patent No.: US 9,082,588 B2
(45) Date of Patent: Jul. 14, 2015

(54) MULTI CHARGED PARTICLE BEAM WRITING APPARATUS AND MULTI CHARGED PARTICLE BEAM WRITING METHOD

(71) Applicant: NuFlare Technology, Inc., Numazu-shi (JP)

(72) Inventor: Hiroshi Matsumoto, Shizuoka (JP)

(73) Assignee: NuFlare Technology, Inc., Numazu-shi (JP)

( * ) Notice: Subject to any disclaimer, the term of this patent is extended or adjusted under 35 U.S.C. 154(b) by 146 days.

(21) Appl. No.: 13/792,320

(22) Filed: Mar. 11, 2013

(65) Prior Publication Data

US 2013/0252172 A1    Sep. 26, 2013

(30) Foreign Application Priority Data

Mar. 22, 2012    (JP) ................. 2012-065386

(51) Int. Cl.
| | |
|---|---|
| *A61N 5/00* | (2006.01) |
| *H01J 37/317* | (2006.01) |
| *G03F 7/20* | (2006.01) |
| *H01J 37/304* | (2006.01) |
| *B82Y 10/00* | (2011.01) |
| *B82Y 40/00* | (2011.01) |

(52) U.S. Cl.
CPC ............ *H01J 37/3177* (2013.01); *B82Y 10/00* (2013.01); *B82Y 40/00* (2013.01); *G03F 7/20* (2013.01); *H01J 37/304* (2013.01); *H01J 2237/24535* (2013.01)

(58) Field of Classification Search
CPC .......... H01J 37/00; H01J 37/02; H01J 37/07; H01J 37/3171; H01J 37/3172; H01J 37/3174; H01J 37/3177

USPC ................. 250/396 R, 492.1, 492.2, 492.21, 250/492.22, 492.23, 492.3
See application file for complete search history.

(56) References Cited

U.S. PATENT DOCUMENTS

| | | | |
|---|---|---|---|
| 5,155,368 A | 10/1992 | Edwards, Jr. et al. | |
| 6,753,253 B1 | 6/2004 | Takahashi et al. | |
| 7,388,214 B2 * | 6/2008 | Maeda ..................... | 250/492.22 |

(Continued)

FOREIGN PATENT DOCUMENTS

| | | |
|---|---|---|
| JP | 2914926 | 4/1999 |
| JP | 2006-261342 | 9/2006 |

OTHER PUBLICATIONS

U.S. Appl. No. 13/770,322, filed Feb. 19, 2013, Matsumoto.

*Primary Examiner* — Jack Berman
*Assistant Examiner* — Jason McCormack
(74) *Attorney, Agent, or Firm* — Oblon, McClelland, Maier & Neustadt, L.L.P.

(57) ABSTRACT

A multi charged particle beam writing apparatus of the present invention includes an aperture member to form multiple beams, a plurality of first deflectors to respectively perform blanking deflection of a corresponding beam, a second deflector to collectively deflect the multiple beams having passed through the plurality of openings of the aperture member so that the multiple beams do not reach the target object, a blanking aperture member to block each beam that has been deflected to be in the off state by the plurality of first deflectors, and a current detector, arranged at the blanking aperture member, to detect a current value of all beams in the on state in the multiple beams that have been deflected by the second deflector.

8 Claims, 11 Drawing Sheets

(56) References Cited

U.S. PATENT DOCUMENTS

| | | |
|---|---|---|
| 8,309,283 B2 | 11/2012 | Kato et al. |
| 2001/0032939 A1* | 10/2001 | Gerlach et al. ............. 250/492.3 |
| 2003/0160190 A1* | 8/2003 | Kawaguchi .............. 250/492.21 |
| 2004/0135102 A1* | 7/2004 | Muraki et al. ........... 250/492.22 |
| 2011/0114853 A1* | 5/2011 | Kobayashi ................ 250/396 R |
| 2011/0253911 A1 | 10/2011 | Matsumoto |

* cited by examiner

MULTI CHARGED PARTICLE BEAM WRITING APPARATUS AND MULTI CHARGED PARTICLE BEAM WRITING METHOD

CROSS-REFERENCE TO RELATED APPLICATION

This application is based upon and claims the benefit of priority from the prior Japanese Patent Application No. 2012-065386 filed on Mar. 22, 2012 in Japan, the entire contents of which are incorporated herein by reference.

BACKGROUND OF THE INVENTION

1. Field of the Invention

The present invention relates to a multi charged particle beam writing apparatus and a multi charged particle beam writing method. For example, the present invention relates to a method of obtaining high accuracy of multi-beam writing.

2. Description of Related Art

The lithography technique that advances microminiaturization of semiconductor devices is extremely important as being a unique process whereby patterns are formed in the semiconductor manufacturing. In recent years, with high integration of LSI, the line width (critical dimension) required for semiconductor device circuits is decreasing year by year. The electron beam (EB) writing technique, which intrinsically has excellent resolution, is used for writing or "drawing" a pattern on a wafer, etc. with an electron beam.

As an example using the electron beam writing technique, there is a writing apparatus using multiple beams (multi-beams). Compared with the case of writing using a single electron beam, since a multi-beam writing apparatus can emit multiple radiation beams at a time, it is possible to greatly increase the throughput. In such a writing apparatus of a multi-beam system, for example, multiple beams are formed by letting an electron beam emitted from an electron gun assembly pass through a mask with a plurality of holes, blanking control is performed for each of the beams, and each unblocked beam is reduced by an optical system and deflected by a deflector so as to irradiate a desired position on a target object or "sample" (refer to, e.g., Japanese Patent Application Laid-open (JP-A) No. 2006-261342).

In order to maintain writing accuracy, it is required to calibrate the amount of beam current. In the single beam system, the amount of beam current can be measured by applying irradiation of a beam to the Faraday cup on the stage. Since only one beam is used in the single beam system, measuring can be performed before and after writing processing. However, unlike the single beam system, since a large number of beams are used in the multi-beam system, it may take several days to measure all of the current value of each beam by using the Faraday cup on the stage. Therefore, the writing processing is stopped during the measurement, thereby causing a problem of reducing the throughput.

BRIEF SUMMARY OF THE INVENTION

In accordance with one aspect of the present invention, a multi charged particle beam writing apparatus includes a stage configured to mount a target object thereon and be movable continuously, an emission unit configured to emit a charged particle beam, an aperture member, in which a plurality of openings are formed, configured to form multiple beams by letting a region including a whole of the plurality of openings be irradiated with the charged particle beam and letting parts of the charged particle beam respectively pass through a corresponding opening of the plurality of openings, a plurality of first deflectors configured to respectively perform blanking deflection of a corresponding beam in the multiple beams having passed through the plurality of openings of the aperture member, a second deflector configured to collectively deflect the multiple beams having passed through the plurality of openings of the aperture member so that the multiple beams do not reach the target object, a blanking aperture member configured to block each beam that has been deflected to be in an off state by the plurality of first deflectors, and a current detector, arranged at the blanking aperture member, configured to detect a current value of all beams in an on state in the multiple beams that have been deflected by the second deflector.

Further, in accordance with another aspect of the present invention, a multi charged particle beam writing apparatus includes a stage configured to mount a target object thereon and be movable continuously, an emission unit configured to emit a charged particle beam, an aperture member, in which a plurality of openings are formed, configured to form multiple beams by letting a region including a whole of the plurality of openings be irradiated with the charged particle beam and letting parts of the charged particle beam respectively pass through a corresponding opening of the plurality of openings, a plurality of deflectors configured to respectively perform blanking deflection of a corresponding beam in the multiple beams having passed through the plurality of openings of the aperture member, a blanking aperture member configured to block each beam that has been deflected to be in an off state by the plurality of deflectors, and a current detector, movably arranged, configured to move in order to block all beams that are in an on state in the multiple beams so that the all beams do not reach the target object, and to detect a current value of the all beams in the on state.

Moreover, in accordance with another aspect of the present invention, a multi charged particle beam writing method includes measuring a current value of a beam group per region of a plurality of regions which are obtained by dividing a multi-beam formation region, for a plurality of beam groups, wherein multiple beams, which respectively have passed through a corresponding opening of a plurality of openings of an aperture member where the plurality of openings are provided to form the multiple beams by being irradiated with a charged particle beam, are separated into the plurality of beam groups, each being per region of the plurality of regions which are obtained by dividing the multi-beam formation region, generating a current distribution of the current value of the beam group of the each region, and judging whether a difference between a current distribution generated last time and the current distribution generated this time is within a tolerance range, wherein, in a case the difference between the current distribution generated last time and the current distribution generated this time is out of the tolerance range, writing is stopped, and in a case the difference between the current distribution generated last time and the current distribution generated this time is within the tolerance range, a pattern is written on a target object by using the multiple beams.

DETAILED DESCRIPTION OF THE INVENTION

In the following Embodiments, there will be described a writing apparatus and method capable of calibrating a current amount of each of multiple beams without reducing the throughput.

Moreover, in the following Embodiments, there will be described a structure in which an electron beam is used as an example of a charged particle beam. The charged particle beam is not limited to the electron beam, and other charged particle beam, such as an ion beam, may also be used.

Embodiment 1

Figure 1:
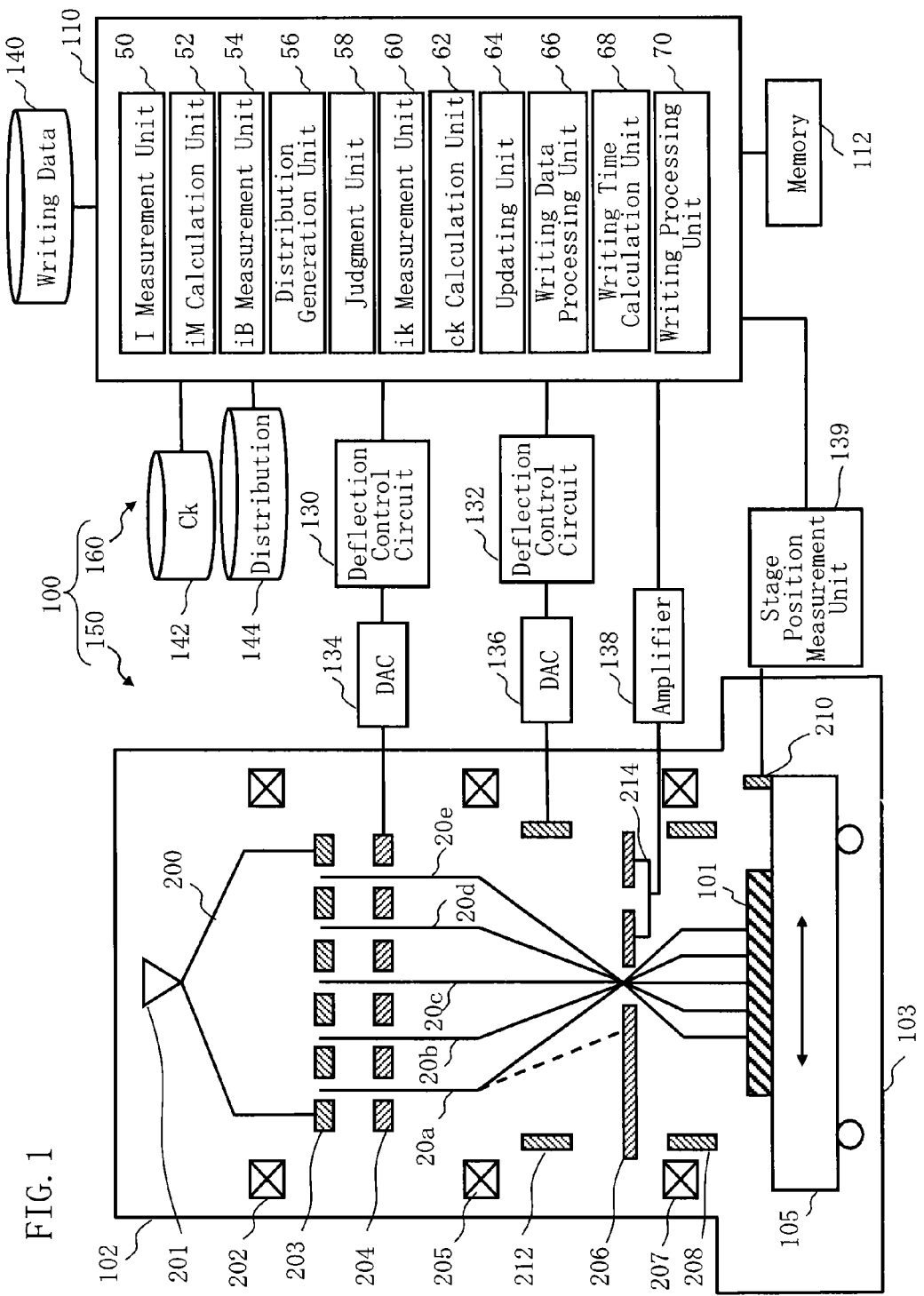
FIG. 1 is a schematic diagram showing a configuration of a writing apparatus according to Embodiment 1.

FIG. 1 is a schematic diagram showing a configuration of a writing apparatus according to Embodiment 1. In FIG. 1, a writing (or "drawing") apparatus 100 includes a writing unit 150 and a control unit 160. The writing apparatus 100 is an example of a multi charged particle beam writing apparatus. The writing unit 150 includes an electron lens barrel 102 and a writing chamber 103. In the electron lens barrel 102, there are arranged an electron gun assembly 201, an illumination lens 202, an aperture member 203, a blanking plate 204, a reducing lens 205, a deflector 212, a limiting aperture member 206, an objective lens 207, and a deflector 208. In the writing chamber 103, there is arranged an XY stage 105, on which a target object or "sample" 101 such as a mask serving as a writing target substrate is placed. The target object 101 is, for example, an exposure mask used for manufacturing semiconductor devices, or a semiconductor substrate (silicon wafer) on which semiconductor elements are formed. The target object 101 may be, for example, a mask blank on which resist is applied and a pattern has not yet been formed. On the XY stage 105, there is arranged a mirror 210 for measuring a position of the XY stage 105. Moreover, a current detector 214 is arranged at the limiting aperture member 206.

In the example of FIG. 1, another opening is provided at a different position from the restriction opening of the limiting aperture member 206, and the current detector 214 is arranged below this opening, however it is not limited thereto. It is also preferable for the current detector 214 to be arranged on the limiting aperture member 206, at a different position from that of the restriction opening of the limiting aperture member 206.

The control unit 160 includes a control computer 110, a memory 112, deflection control circuits 130 and 132, digital-to-analog converter (DAC) amplifiers 134 and 136, an amplifier 138, a stage position measurement unit 139, and storage devices 140, 142, and 144, such as magnetic disk drives. The control computer 110, the memory 112, the deflection control circuits 130 and 132, the amplifier 138, the stage position measurement unit 139, and the storage devices, 140, 142, and 144 are mutually connected through a bus (not shown). Writing data is input into the storage device 140 (storage unit) from the outside to be stored therein.

In the control computer 110, there are arranged an all beam current measurement unit 50, an average current calculation unit 52, a beam group current measurement unit 54, a distribution generation unit 56, a judgment unit 58, an individual beam current measurement unit 60, a correction coefficient calculation unit 62, an updating unit 64, a writing data processing unit 66, a writing time calculation unit 68, and a writing processing unit 70. Then, each function of them may be configured by hardware such as an electronic circuit, or by software such as a program implementing these functions. Alternatively, they may be configured by a combination of software and hardware. Data which is input and output to/from the all beam current measurement unit 50, the average current calculation unit 52, the beam group current measurement unit 54, the distribution generation unit 56, the judgment unit 58, the individual beam current measurement unit 60, the correction coefficient calculation unit 62, the updating unit 64, the writing data processing unit 66, the writing time calculation unit 68, and the writing processing unit 70, and data being calculated are stored in the memory 112 each time.

As described above, FIG. 1 shows a structure necessary for explaining Embodiment 1. Other structure elements generally necessary for the writing apparatus 100 may also be included.

Figure 2A:
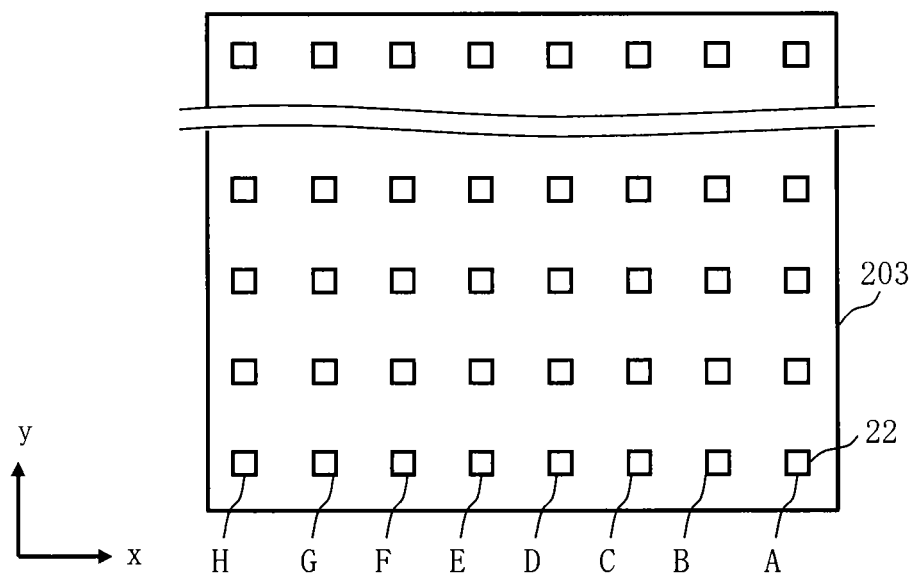
FIGS. 2A and 2B are schematic diagrams each showing a configuration of an aperture member according to Embodiment 1.
Figure 2B:
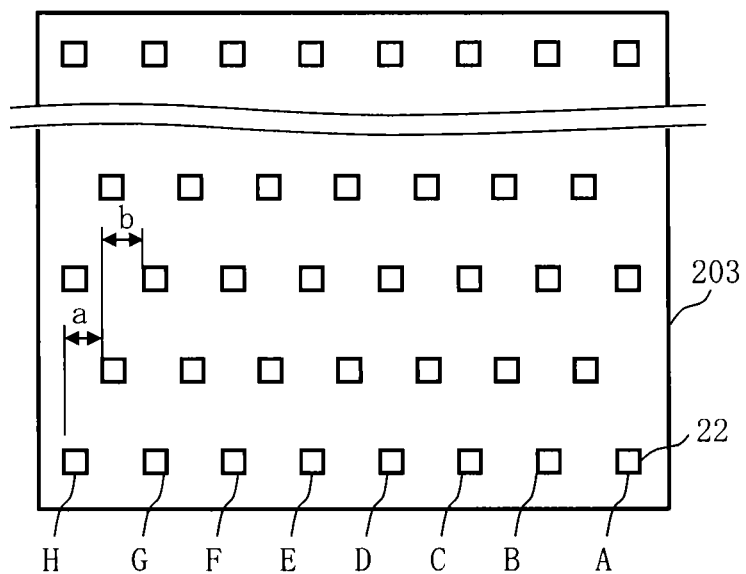

FIGS. 2A and 2B are schematic diagrams each showing an example of the configuration of an aperture member according to Embodiment 1. In FIG. 2A, holes (openings) 22 are formed at a predetermined arrangement pitch, in the shape of a matrix, in the aperture member 203, wherein m×n (m≥2, n≥2) holes 22 are arranged in m columns in the vertical direction (the y direction) and n rows in the horizontal direction (the x direction). In FIG. 2A, holes 22 of 512 (rows)×8 (columns) are formed, for example. Each hole 22 has the same dimension and shape of a quadrangle. Alternatively, each hole may be a circle of the same circumference. In this case, there is shown an example of each row having eight holes 22 from A to H in the x direction. Multi-beams 20 are formed by letting parts of an electron beam 200 respectively pass through a corresponding hole of a plurality of holes 22. Here, there is shown the case where the holes 22 are arranged in a plurality of columns and rows in both the x and the y directions, but it is not limited thereto. For example, it is also acceptable to arrange a plurality of holes 22 in only one row or in only one column, that is, in one row where a plurality of holes are arranged as columns, or in one column where a plurality of holes are arranged as rows. Moreover, the method of arranging the holes 22 is not limited to the case of FIG. 2A where holes are aligned in a grid. It is also preferable to arrange the holes 22 as shown in FIG. 2B where the position of each hole in the second row is shifted from the position of each hole in the first row by a dimension "a" in the horizontal direction (x direction), for example. Similarly, it is also preferable to arrange the holes 22 such that the position of each hole in the third row is shifted from the position of each hole in the second row by a dimension "b" in the horizontal direction (x direction).

Figure 3:
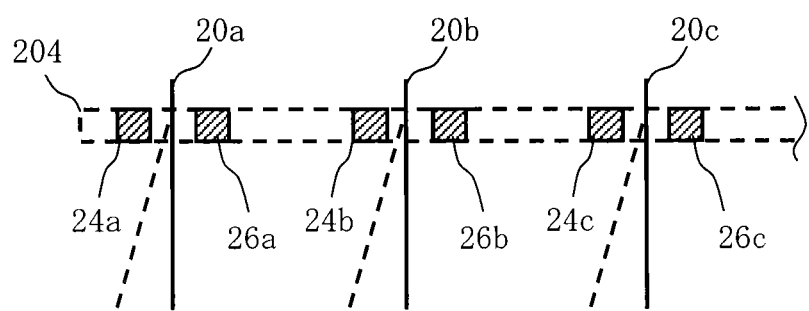
FIG. 3 is a schematic diagram showing a configuration of a blanking plate according to Embodiment 1.

FIG. 3 is a schematic diagram showing the configuration of a blanking plate according to Embodiment 1. In the blanking plate 204, a passage hole is formed to be corresponding to the arrangement position of each hole 22 of the aperture member 203, and a pair of electrodes 24 and 26 (blanker: the first deflector) is arranged for each passage hole. The electron beams 20 (multiple beams) respectively passing through a corresponding passage hole are respectively deflected by the voltage applied to the two electrodes 24 and 26 being a pair, and blanking control is performed by this deflection. Thus, a plurality of blankers respectively perform blanking deflection of a corresponding beam in the multiple beams having passed through a plurality of holes 22 (openings) of the aperture member 203.

The electron beam 200 emitted from the electron gun assembly 201 (emission unit) almost perpendicularly illuminates the whole of the aperture member 203 by the illumination lens 202. A plurality of holes (openings), each being a quadrangle, are formed in the aperture member 203. The region including all the plurality of holes is irradiated with the electron beam 200. For example, a plurality of quadrangular electron beams (multiple beams) 20a to 20e are formed by letting parts of the electron beam 200 irradiating the positions of a plurality of holes pass through a corresponding hole of the plurality of holes of the aperture member 203 respectively. The multiple beams 20a to 20e respectively pass through a corresponding blanker (the first deflector) of the blanking plate 204. Each blanker deflects (performs blanking deflection) each of the electron beams 200 passing respectively. The multiple beams 20a, 20b, ..., 20e, having passed through the blanking plate 204 are reduced by the reducing lens 205, and go toward the hole at the center of the limiting aperture member 206. At this stage, the electron beam 20 which was deflected by the blanker of the blanking plate 204 deviates from the hole of the center of the limiting aperture member 206 (blanking aperture member) and is blocked by the limiting aperture member 206. On the other hand, the electron beam 20 which was not deflected by the blanker of the blanking plate 204 passes through the hole at the center of the limiting aperture member 206. Blanking control is performed by on/off of the blanker so as to control on/off of the beam. Thus, the limiting aperture member 206 blocks each beam which was deflected to be in the "beam off" state by each of a plurality of blankers. Then, one beam shot is formed by beams which have been formed during from the "beam on" state to the "beam off" state and have passed through the limiting aperture member 206. The multi-beams 20 having passed through the limiting aperture member 206 are focused by the objective lens 207 in order to be a pattern image of a desired reduction ratio, and respective beams (the entire multi-beams 20) having passed through the limiting aperture member 206 are collectively deflected in the same direction by the deflector 208 so as to irradiate respective irradiation positions on the target object 101. While the XY stage 105 is continuously moving, controlling is performed by the deflector 208 so that irradiation positions of beams may follow the movement of the XY stage 105, for example. Ideally, multi-beams 20 to irradiate at a time are aligned at pitches obtained by multiplying the arrangement pitch of a plurality of holes of the aperture member 203 by a desired reduction ratio described above. The writing apparatus 100 performs a writing operation by the raster scan method which continuously irradiates shot beams in order, and when writing a desired pattern, a required beam is controlled by blanking control to be "beam on" according to a pattern.

Figure 4A:
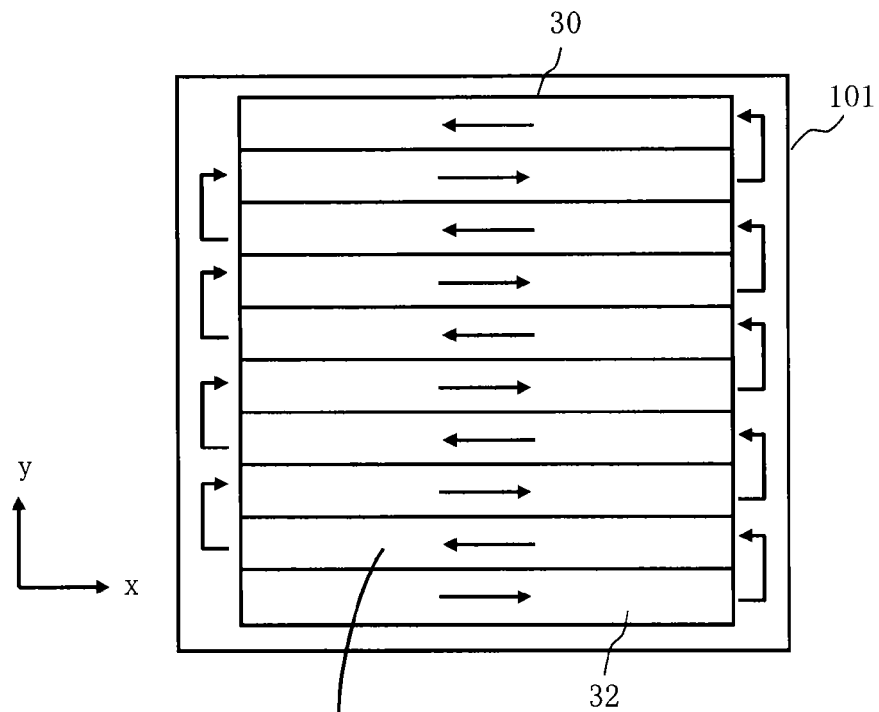
FIGS. 4A to 4C are schematic diagrams explaining a writing operation according to Embodiment 1.
Figure 4B:
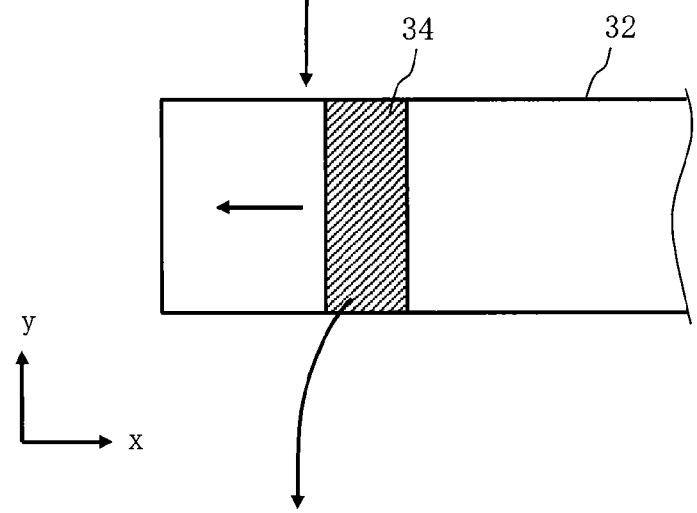
Figure 4C:
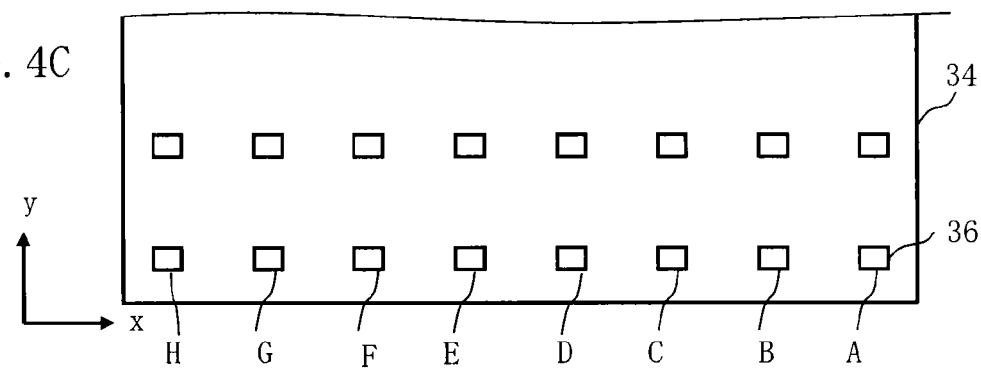

FIGS. 4A to 4C are schematic diagrams explaining a writing operation according to Embodiment 1. As shown in FIG. 4A, a writing region 30 of the target object 101 is virtually divided into a plurality of strip-shaped stripe regions 32 each having a predetermined width in the y direction, for example. Each of the stripe regions 32 serves as a writing unit region. First, the XY stage 105 is moved and adjusted such that an irradiation region 34 to be irradiated with one-time irradiation of the multi-beams 20 is located at the left end of the first stripe region 32 or at a position more left than the left end, and then writing is started. When writing the first stripe region 32, the writing advances relatively in the x direction by moving the XY stage 105 in the −x direction, for example. The XY stage 105 is continuously moved at a predetermined speed, for example. After writing the first stripe region 32, the stage position is moved in the −y direction and adjusted such that the irradiation region 34 is located at the right end of the second stripe region 32 or at a position more right than the right end, and located to be relatively in the y direction. Then, similarly, as shown in FIG. 4B, writing advances in the −x direction by moving the XY stage 105 in the x direction, for example. That is, writing is performed while alternately changing the direction, such as performing writing in the x direction in the third stripe region 32, and in the −x direction in the fourth stripe region 32, and thus, the writing time can be reduced. However, the writing operation is not limited to the case of performing writing while alternately changing the direction, and it is also acceptable to perform writing in the same direction when writing each stripe region 32. By one shot, as shown in FIG. 4C, a plurality of shot patterns 36 of the same number as the holes 22 are formed at a time by multiple beams which have been formed by passing through respective corresponding holes 22 of the aperture member 203. For example, a beam which passed through one hole A of the aperture member 203 irradiates the position "A" shown in FIG. 4C and forms a shot pattern 36 at this position. Similarly, a beam which passed through one hole B of the aperture member 203 irradiates the position "B" shown in FIG. 4C and forms another shot pattern 36 at this position, for example. Hereafter, a similar operation is performed with respect to C to H. Then, the raster scan method is employed when writing each stripe 32, wherein while the XY stage 105 is moved in the x direction, the deflector 208 performs deflection such that each shot moves (scans) in the y direction or in the x and y directions in order and shot beam radiation is continuously emitted in order.

Figure 5:
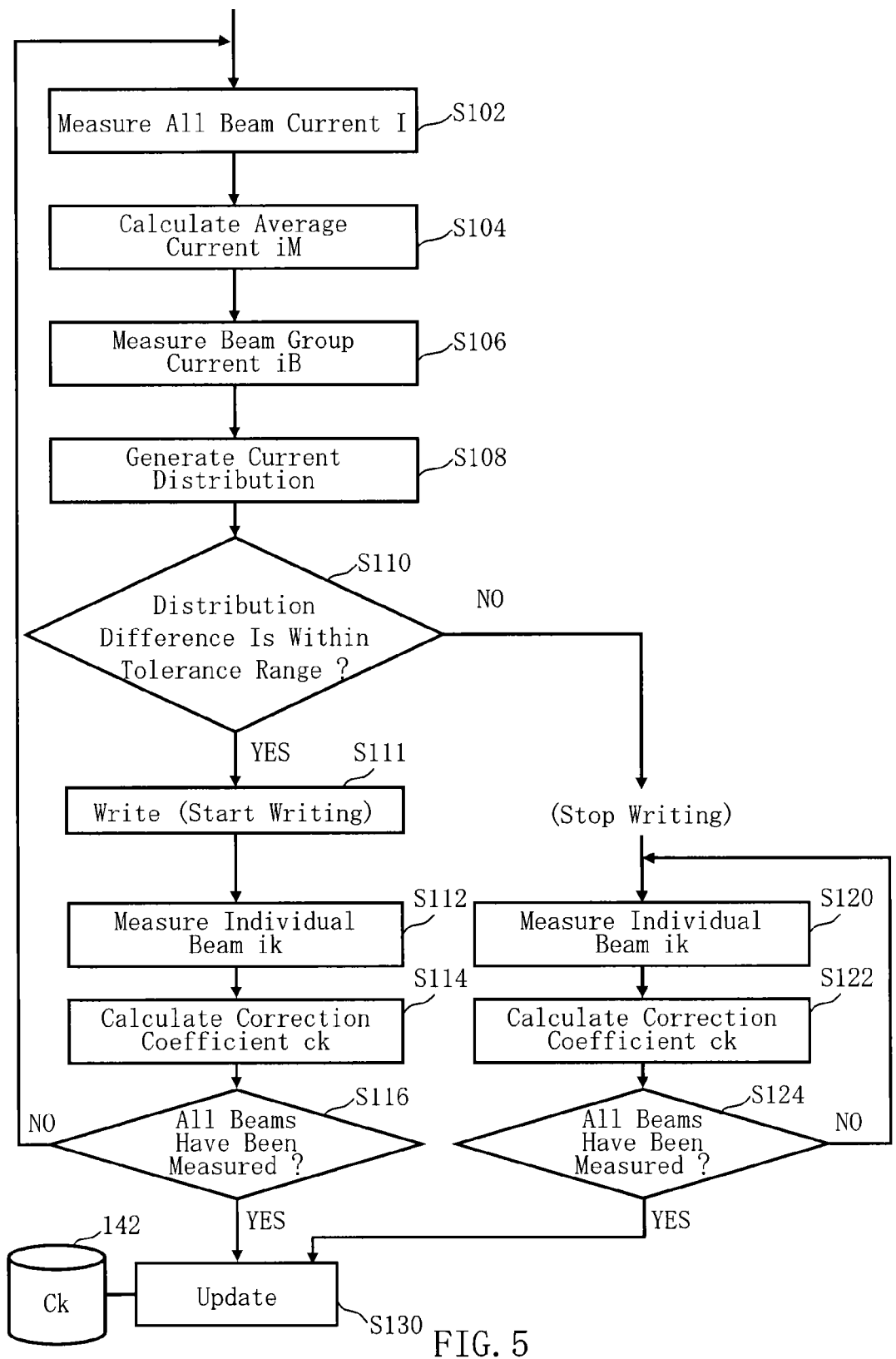
FIG. 5 is a flowchart showing main steps of a writing method according to Embodiment 1.

FIG. 5 is a flowchart showing main steps of a writing method according to Embodiment 1. In FIG. 5, the writing method according to Embodiment 1 executes a series of steps: an all beam current measurement step (S102), an average current calculation step (S104), a beam group current measurement step (S106), a current distribution generation step (S108), a judgment step (S110), a writing step (S111), an individual beam current measurement step (S112), a correction coefficient calculation step (S114), a judgment step (S116), an individual beam current measurement step (S120), a correction coefficient calculation step (S122), a judgment step (S124), and an updating step (S130).

In the all beam current measurement step (S102), the all beam current (I) measurement unit 50 measures a beam current value (all beam current I) of all the electron beams (multi-beam) 20a to 20e which have been formed by respectively passing through a corresponding hole of the plurality of holes 22 of the aperture member 203. Specifically, it operates as described below.

Figure 6:
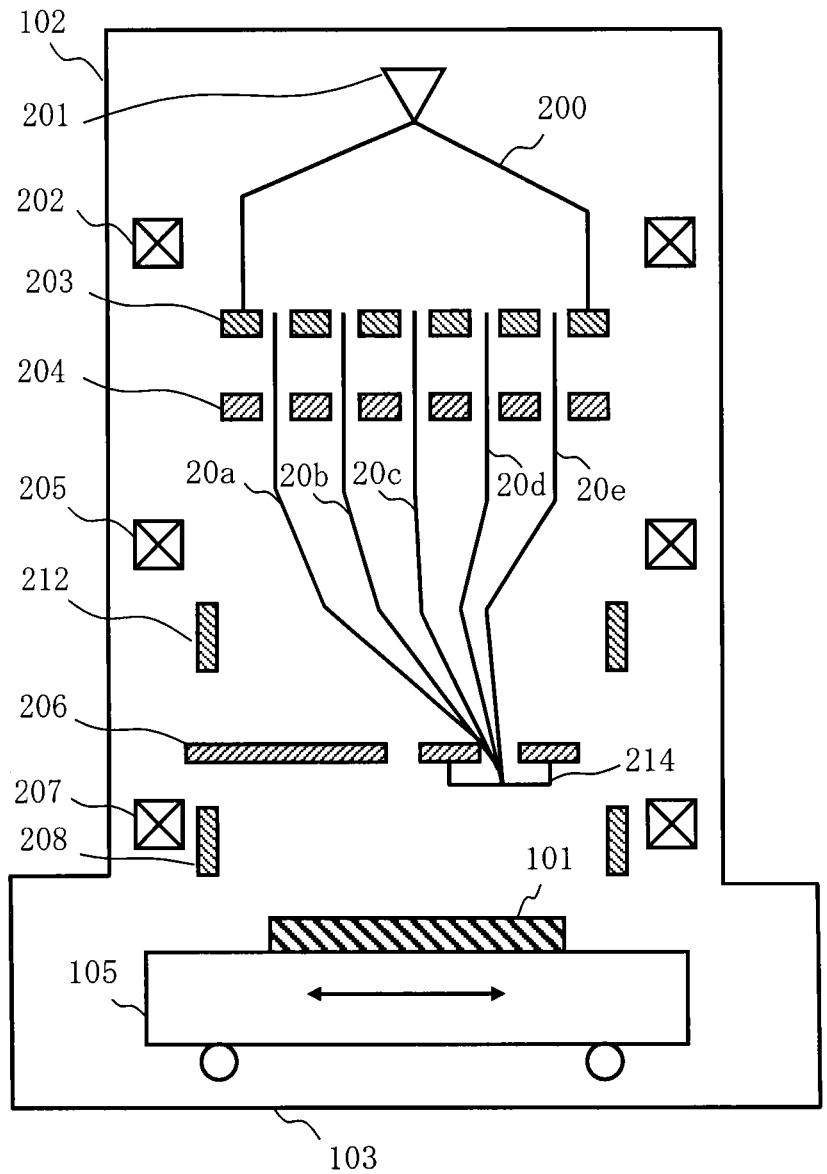
FIG. 6 is a schematic diagram explaining a method of measuring all beam current according to Embodiment 1.

FIG. 6 is a schematic diagram explaining a method of measuring an all the beam current according to Embodiment 1. All the electron beams (multi-beam) 20a to 20e which have been formed by respectively passing through a corresponding hole of the plurality of holes 22 of the aperture member 203 are collectively deflected by a deflector (the second deflector)

onto the current detector 214 arranged at the limiting aperture member 206. Thereby, it is possible to irradiate the current detector 214 with all the beams. Therefore, the current detector 214 can detect a current value of all the beams in the on state in the multiple beams. Thus, the beams are blocked before reaching the writing chamber 103. Accordingly, the beams never reach the stage 105 and the target object 101. Data measured by the current detector 214 is converted to a digital signal by the amplifier 138, and output to the all beam current (I) measurement unit 50. Thereby, the all beam current (I) measurement unit 50 can measure an all beam current I.

In the average current calculation step (S104), the average current calculation unit 52 calculates an average current iM per beam by dividing the measured all beam current I by the number of beams.

In advance, multiple beams are separated into a plurality of beam groups, each being per region of a plurality of regions which are obtained by dividing a multi-beam formation region.

In the beam group current measurement step (S106), the beam group current measurement unit 54 (measurement unit) measures a current value iB of a beam group of each region by using the current detector 214. For example, a region 10, where a plurality of holes 22 are formed in the aperture member 203, is divided into a plurality of mesh regions. For example, it is preferable to divide the region 10 into mesh regions where the number of beams in each region is 10×10. Although the case of FIGS. 2A and 2B in which the holes 22 of 512 (rows)×8 (columns) are formed in a matrix has been shown, it is also preferable to form the holes 22 of 512×512 in a matrix, for example. Alternatively, multiple beams more than 512×512 or multiple beams less than 512×8 may be formed. Then, the blanker in the blanking plate 204 performs deflection so that only the beam group (for example, a beam group of 10×10 beams) in the mesh region being a measurement object may be in the "beam on" state and the other beams may be in the "beam off" state. Thus, what is necessary for the deflector 212 is to collectively deflect all the beams, using a deflection amount by which only the beam group (for example, a beam group of 10×10 beams) in the on state irradiates the current detector 214. Thereby, it is possible to irradiate the current detector 214 only with the object beam group in the target mesh region. Therefore, the current detector 214 can detect a current value of all the beams in the on state in the multiple beams. The remaining beams are blocked by the limiting aperture member 206. Accordingly, the beams are blocked before reaching the writing chamber 103. Thus, the beams never reach the stage 105 and the target object 101. Data measured by the current detector 214 is converted to a digital signal by the amplifier 138, and output to the beam group current measurement unit 54. Thereby, the beam group current (iB) measurement unit 54 can measure a current iB of the beam group in the target mesh region. This operation described above is executed for all the mesh regions. Thus, a beam group current iB of each beam group (each mesh region) can be measured.

In the current distribution generation step (S108), the distribution generation unit 56 (current distribution generation unit) generates a current distribution of current values iB of the beam groups of all the measured regions (mesh regions). The generated current distribution is stored in the memory 144.

Figure 7:
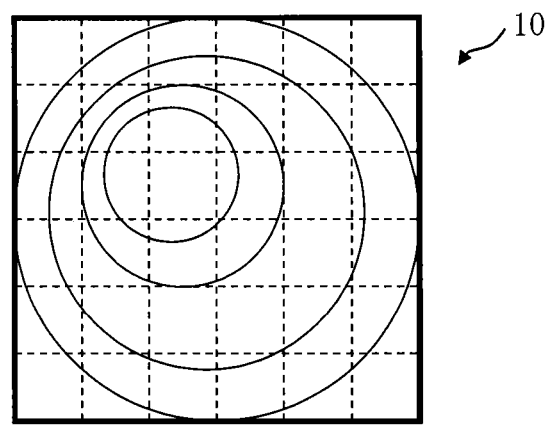
FIG. 7 shows an example of current distribution according to Embodiment 1.

FIG. 7 shows an example of the current distribution according to Embodiment 1. The current distribution 10 as shown in FIG. 7, for example, can be generated by depicting the beam group current iB of each beam group region (mesh region) by using contour lines.

In the judgment step (S110), the judgment unit 58 judges whether a difference between the current distribution generated last time and the current distribution generated this time is within a tolerance range. If the shapes of the current distributions 10 are different from each other (the difference between them is out of the tolerance range), it turns out that the state of the cathode in the electron gun assembly 201 has changed. In the case where the cathode state has changed, there is a high possibility that individual beam currents have also changed. Therefore, it is difficult to perform writing processing in the current status as it is. Therefore, when the difference between the current distribution generated last time and the current distribution generated this time is out of the tolerance range, the writing processing is stopped and it goes to the individual beam current measurement step (S120). On the other hand, when the difference between the current distribution generated last time and the current distribution generated this time is within the tolerance range, it goes to the writing step (S111). Then, when the difference between the current distribution 10 of the last time and that of this time is within the tolerance range, a pattern is written on the target object 101 by using the multi-beam 20.

In the writing step (S111), the writing processing unit 70 controls writing processing to write a pattern on the target object 101 by using the multi-beam 20. Specifically, the writing processing is performed as described below. The writing data processing unit 66 controlled by the writing processing unit 70 reads writing data from the storage device 140, for each stripe region 32, and performs data conversion processing of an a plurality of steps to generate shot data unique to the apparatus. During this procedure, the writing time calculation unit 68 corrects the dose of each beam, using a correction coefficient ck stored in storage device 142. A dose D is adjusted according to an irradiation time tk of a beam. Specifically, the irradiation time tk of a beam is calculated based on tk=D/(iM×ck/Δ), wherein Δ denotes a beam area.

In parallel to the data processing, the writing processing unit 70 transfers the target object 101 to the stage 105 in the writing chamber 103 through a transfer channel (not shown). The deflection control circuit 130 generates a signal for blanking control of a shot concerned to be performed by each blanker, for a shot, based on the shot data, and the signal is amplified by the DAC amplifier 134 and converted from a digital to an analog signal to be output to each blanker.

The deflection control circuit 132 calculates deflection amounts in the x and y directions of each shot, generates a signal for deflection. Then, the signal is amplified by the DAC amplifier 136 and converted from a digital to an analog signal to be output to the deflector 208.

The writing unit 150 writes a pattern in each stripe region 32 of the target object 101, using the multi-beam 20. Then, as described above, the writing processing is performed continuously for each stripe region 32. Therefore, whenever the writing processing of a target stripe region 32 has completed, the stage 105, on which the target object is laid, is moved so that a beam may irradiate a writing starting position in a stripe region to be written next.

In the individual beam current measurement step (S112), the individual beam current measurement unit 60 respectively measures a current value ik of each beam of the multiple beams. Specifically, it operates as described below.

Figure 8:
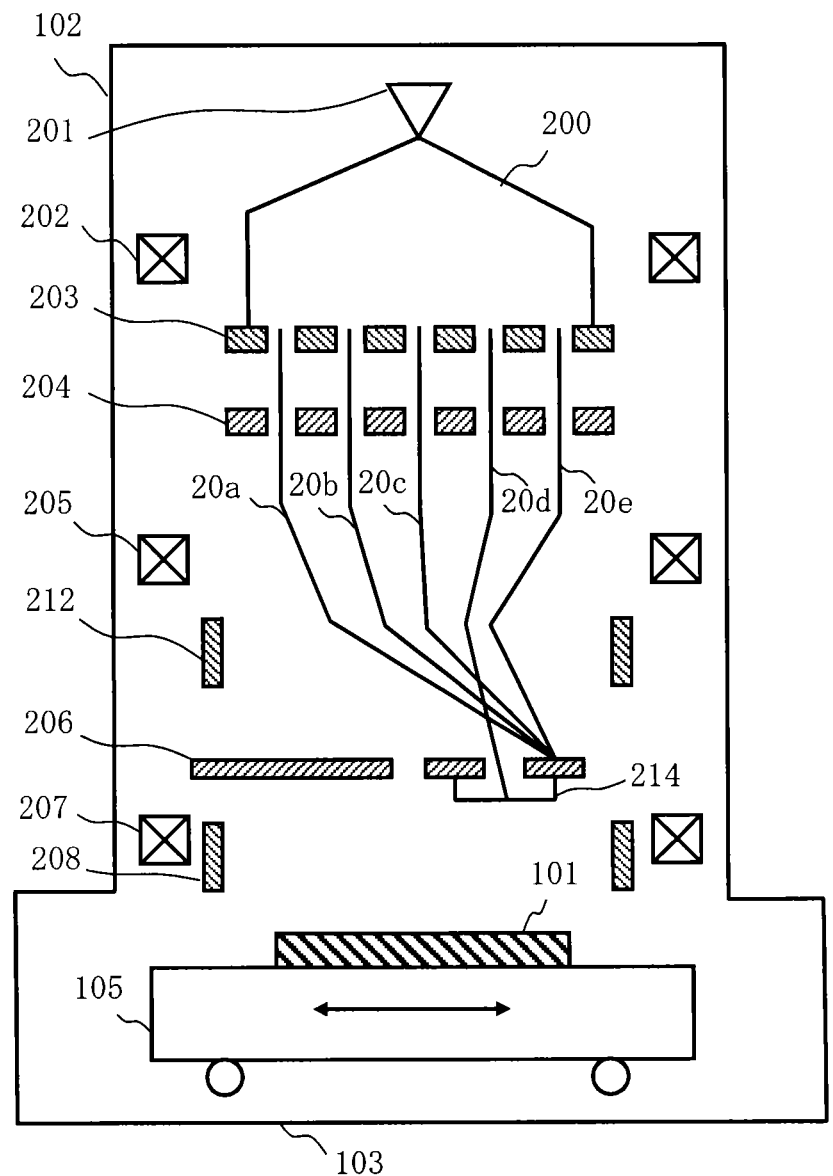
FIG. 8 is a schematic diagram explaining a method of measuring an individual beam current according to Embodiment 1.

FIG. 8 is a schematic diagram explaining a method of measuring an individual beam current according to Embodiment 1. The blanker in the blanking plate 204 performs deflection so that only the beam(s) being a measurement object may be in the on state and other beams may be in the off state. Thus, what is necessary for the deflector 212 is to collectively deflect all the beams, using a deflection amount by which only the beam(s) in the on state can irradiate the current detector 214. Thereby, it is possible to irradiate the current detector 214 only with the object beam 20d. Therefore, the current detector 214 can detect a current value of all the beams (in this case, one beam) in the on state in the multiple beams. The remaining beams are blocked by the limiting aperture member 206. Accordingly, the beams are blocked before reaching the writing chamber 103. Thus, the beams never reach the stage 105 and the target object 101. Data measured by the current detector 214 is converted to a digital signal by the amplifier 138, and output to the individual beam current measurement unit 60. Thereby, the individual beam current (ik) measurement unit 60 can measure a current ik of the object beam. This operation described above is executed for all the beams. Thereby, the beam current ik of each beam can be measured. However, the current value ik of each beam is measured at the time of transferring the target object 101 or moving between a plurality of stripe regions 32. That is, not all the individual beam current values ik are measured at a time, but an individual beam current value ik of each beam is measured in order while performing writing processing, during the time in which the target object is not actually irradiated with beams, such as a time of transferring the target object or moving between stripes. Thereby, it is possible to overlap the time period of transferring the target object or moving between stripes, etc., with the time period of measuring an individual beam current value ik, which prevents reduction of the throughput.

According to Embodiment 1, when measuring beam currents, since beams are blocked before reaching the writing chamber 103, it is possible to freely perform transferring the target object to the stage or moving the stage. Thereby, it is also possible to overlap the time period during processing on the stage, such as transferring the target object to the stage or measuring height distribution of the target object 101 or the time period during an operation performed with moving the stage, with the time period of measuring an individual beam current value ik, which further prevents reduction the throughput.

In the correction coefficient calculation step (S114), the correction coefficient calculation unit 62 calculates, for each of the multiple beams, a correction coefficient ck of the beam concerned for correcting a dose D of the beam concerned when performing writing, by using a current value ik of the beam concerned and an average current iM. Specifically, it can be calculated by ck=ik/iM.

The individual beam current measurement step (S112) and the correction coefficient calculation step (S114) are repeatedly performed as many times as possible during the writing processing.

In the judgment step (S116), the writing processing unit 70 judges, when the writing processing is completed, whether all the individual beam currents ik have been measured or not. As a result of the judgment, if there is still an individual beam current ik which has not been measured, it returns to the all beam current measurement step (S102) in order to measure the individual beam current ik which has not been measured yet, in the next writing processing. For example, when all the individual beam currents ik have been measured by having performed writing processing of several times, such as writing patterns on several target objects, it goes to an updating step (S130).

In the updating step (S130), the updating unit 64 outputs a newly calculated correction coefficient ck of each beam to the storage device 142 in order to update the data already stored. Therefore, in the writing step (S111) which is to be performed after the updating, the irradiation time tk of each beam can be corrected by the newest correction coefficient ck.

On the other hand, in the judgment step (S110), if it is judged that the shapes of the current distributions 10 are different from each other (the difference between them is out of the tolerance range), it is difficult to perform writing processing in the current status as it is. Therefore, writing processing is stopped and it becomes necessary firstly to readjust the correction coefficient ck of the individual beam before performing writing. Then, steps are advanced as described below.

In the individual beam current measurement step (S120), the individual beam current measurement unit 60 measures an individual beam current ik, in the state in which the writing processing is stopped. The measurement method may be the same as that of the individual beam current measurement step (S112) described above.

In the correction coefficient calculation step (S122), the correction coefficient calculation unit 62 calculates a correction coefficient ck of each beam. The calculation method is the same as that of the correction coefficient calculation step (S114).

In the judgment step (S124), the writing processing unit 70 judges whether all the individual beam currents ik have been measured or not. As a result of the judgment, if there is still an individual beam current ik which has not been measured, it returns to the individual beam current measurement step (S120). Each of the steps from the individual beam current measurement step (S120) to the judgment step (S124) is repeated until all the individual beam currents ik have been measured. Since highly precise writing processing is not able to be performed until the correction coefficients ck have been updated, it is preferable to measure all the individual beam currents ik at a time. Then, in the updating step (S130), a newly calculated correction coefficient ck of each beam is output to the storage device 142 in order to update the data already stored therein.

As described above, according to Embodiment 1, the current amount of each of the multiple beams can be measured without reducing the throughput. Therefore, the current amount of each of the multiple beams can be calibrated without reducing the throughput.

Embodiment 2

Although, according to Embodiment 1, a current value of an object beam (all beams, a beam group, or an individual beam) is measured by deflecting the entire multiple beams by using the deflector 212, it is not limited thereto. In Embodiment 2, there will be explained a structure in which a current value of an object beam (all beams, a beam group, or an individual beam) is measured by moving a current detector.

Figure 9:
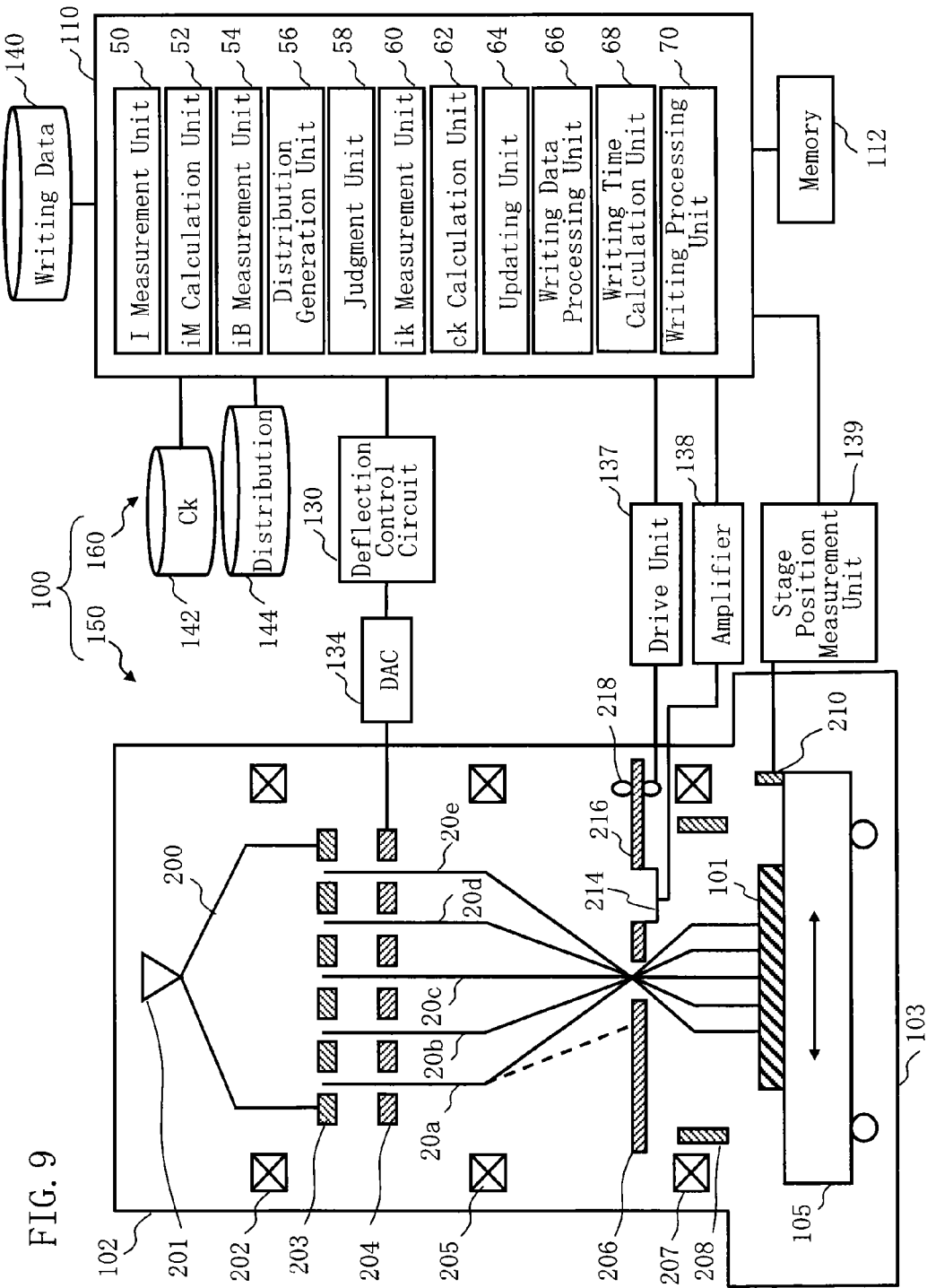
FIG. 9 is a schematic diagram showing a configuration of a writing apparatus according to Embodiment 2.

FIG. 9 is a schematic diagram showing a configuration of a writing apparatus according to Embodiment 2. FIG. 9 is the same as FIG. 1 except that, in addition to the limiting aperture member 206, a moving member 216 is arranged, the current detector 214 is arranged at the moving member 216, a drive mechanism 218 for slidingly moving the moving member 216 is arranged, and a drive unit 137 for controlling the drive mechanism 218 is arranged. It is preferable for the current detector 214 to be arranged between the reducing lens 205 and the limiting aperture member 206 or between the limiting aperture member 206 and the target object 101. Further, it is more preferable for the current detector 214 to be arranged just above or just below the limiting aperture member 206.

In addition, the writing method according to Embodiment 2 is the same as that of FIG. 6. Moreover, the content of Embodiment 2 is the same as that of Embodiment 1 except what is particularly described below.

Figure 10:
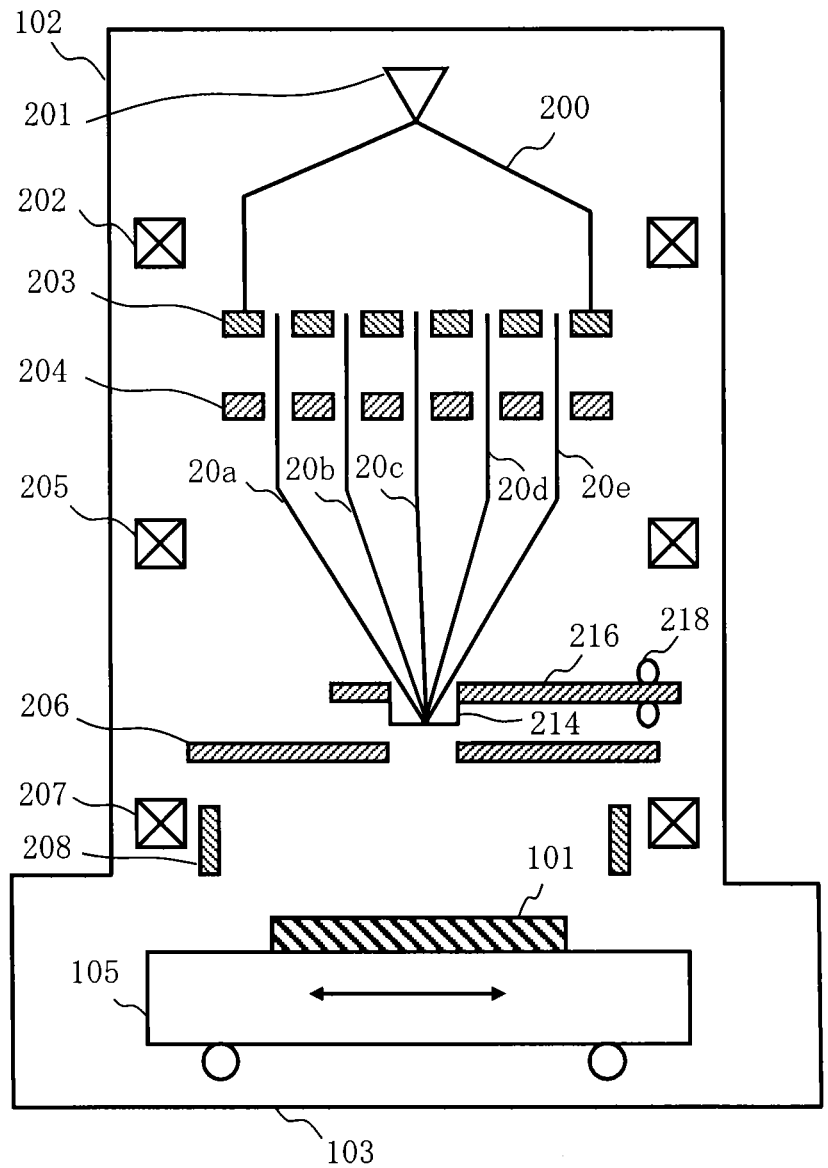
FIG. 10 is a schematic diagram explaining a method of measuring all beam current according to Embodiment 2.

FIG. 10 is a schematic diagram explaining a method of measuring an all beam current according to Embodiment 2. In the all beam current measurement step (S102), the drive unit 137 controlled by the writing processing unit 70 makes the drive mechanism 218 actuate so that the current detector 214 may be moved to be located above the restriction opening of the limiting aperture member 206. In addition, it should be understood that when the current detector 214 is arranged at the downstream side of the limiting aperture member 206, the current detector 214 should be moved to be located below the restriction opening of the limiting aperture member 206.

All the electron beams (multi-beam) 20a to 20e formed by respectively having passed through a corresponding hole of a plurality of holes 22 of the aperture member 203, all of which are in the "beam on" state, go toward the restriction opening of the limiting aperture member 206. Thereby, it is possible to irradiate the current detector 214 with all the beams. Therefore, the current detector 214 can detect a current value of all the beams in the on state in the multiple beams. Thus, the beams are blocked before reaching the writing chamber 103. Accordingly, the beams never reach the stage 105 and the target object 101. Data measured by the current detector 214 is converted to a digital signal by the amplifier 138, and output to the all beam current (I) measurement unit 50. Thereby, the all beam current (I) measurement unit 50 can measure an all beam current I.

In the beam group current measurement step (S106), similarly, the drive unit 137 controlled by the writing processing unit 70 makes the drive mechanism 218 actuate so that the current detector 214 may be moved to be located above the restriction opening of the limiting aperture member 206. Then, the blanker in the blanking plate 204 performs deflection so that only the beam group (for example, a beam group of 10×10 beams) in the mesh region being a measurement object may be in the "beam on" state and the other beams may be in the "beam off" state. Therefore, the object beam group in the "beam on" state goes toward the restriction opening of the limiting aperture member 206. Thereby, it is possible to irradiate the current detector 214 only with the object beam group in the target mesh region. Therefore, the current detector 214 can detect a current value of all the beams in the on state in the multiple beams. The remaining beams are blocked by the limiting aperture member 206 or the moving member 216. Accordingly, the beams are blocked before reaching the writing chamber 103. Thus, the beams never reach the stage 105 and the target object 101. Data measured by the current detector 214 is converted to a digital signal by the amplifier 138, and output to the beam group current measurement unit 54. Thereby, the beam group current (iB) measurement unit 54 can measure a current iB of the beam group in the target mesh region. This operation described above is executed for all the mesh regions. Thus, a beam group current iB of each beam group (each mesh region) can be measured.

Figure 11:
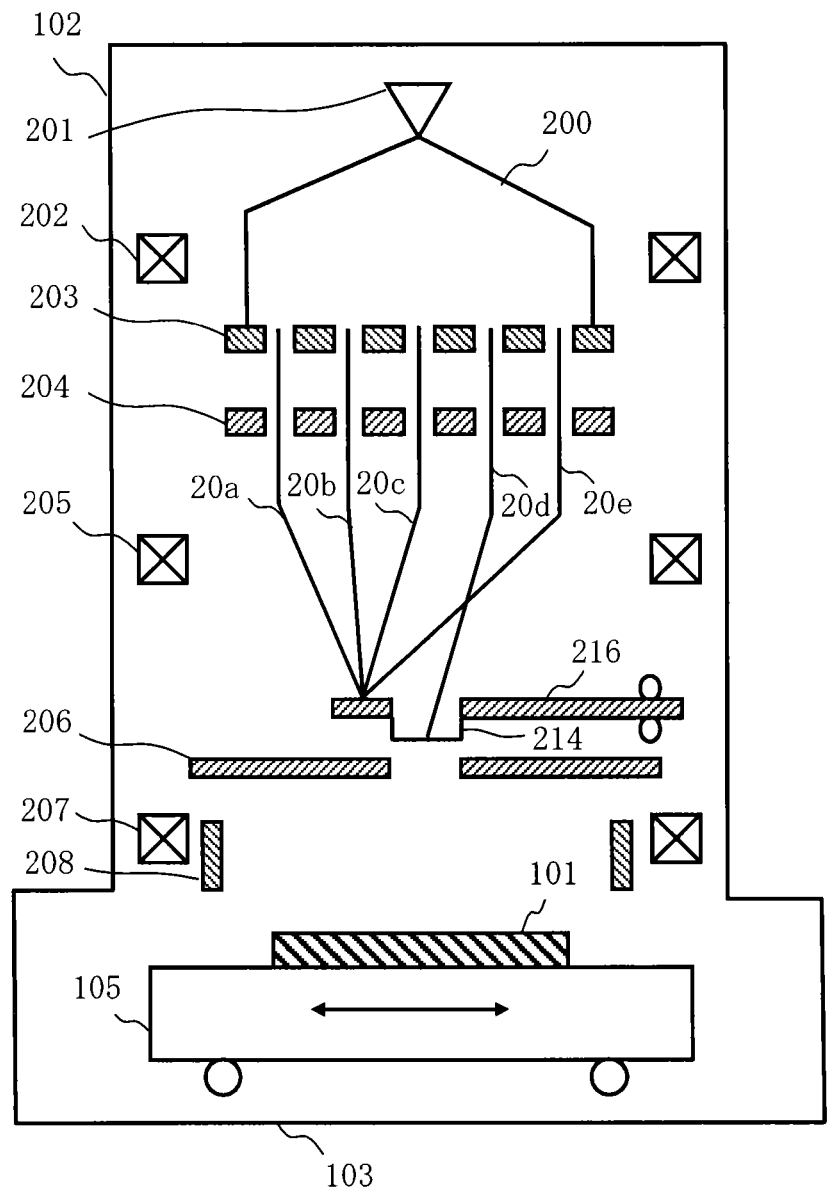
FIG. 11 is a schematic diagram explaining a method of measuring an individual beam current according to Embodiment 2.

FIG. 11 is a schematic diagram explaining a method of measuring an individual beam current according to Embodiment 2. In the individual beam current measurement step (S112), similarly, the drive unit 137 controlled by the writing processing unit 70 makes the drive mechanism 218 actuate so that the current detector 214 may be moved to be located above the restriction opening of the limiting aperture member 206. The blanker in the blanking plate 204 performs deflection so that only the beam being a measurement object may be in the on state and other beams may be in the off state. Then, the object beam in the on state goes toward the restriction opening of the limiting aperture member 206. Thereby, only the object beam 20d can irradiate the current detector 214. Therefore, the current detector 214 can detect a current value of all the beams (in this case, one beam) in the on state in the multiple beams. The remaining beams are blocked by the limiting aperture member 206 or the moving member 216. Accordingly, the beams are blocked before reaching the writing chamber 103. Thus, the beams never reach the stage 105 and the target object 101. Data measured by the current detector 214 is converted to a digital signal by the amplifier 138, and output to the individual beam current measurement unit 60. Thereby, the ik current measurement unit 60 can measure a current ik of the object beam. This operation described above is executed for all the beams. Thereby, the beam current ik of each beam can be measured. However, the current value ik of each beam is measured at the time of transferring the target object 101, or moving between a plurality of stripe regions 32. That is, not all the individual beam current values ik are measured at a time, but an individual beam current ik of each beam is measured in order while performing writing processing, during the time in which the target object is not actually irradiated with beams, such as a time of transferring the target object or moving between stripes. Thereby, it is possible to overlap the time period of transferring the target object or moving between stripes, etc., with the time period of measuring an individual beam current value ik, which prevents reduction of the throughput.

As described above, according to Embodiment 2, a beam current can be measured by moving the current detector 214 before the beam reach the stage 105 or the target object 101. This structure as well as that according to Embodiment 1 can measure the current amount of each of multiple beams without reducing the throughput. Therefore, the current amount of each of multiple beams can be calibrated without reducing the throughput.

Embodiments have been explained referring to concrete examples described above. However, the present invention is not limited to these specific examples. The raster scanning operation described above is just an example, and it is also acceptable to use other operation method instead of the raster scanning operation using multiple beams.

While the apparatus configuration, control method, etc. not directly necessary for explaining the present invention are not described, some or all of them may be suitably selected and used when needed. For example, although description of the configuration of a control unit for controlling the writing apparatus 100 is omitted, it should be understood that some or all of the configuration of the control unit is to be selected and used appropriately when necessary.

In addition, any other multi charged particle beam writing apparatus and a method thereof that include elements of the present invention and that can be appropriately modified by those skilled in the art are included within the scope of the present invention.

Additional advantages and modification will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A multi charged particle beam writing apparatus comprising:
a stage configured to mount a target object thereon and be movable continuously;
an emission unit configured to emit a charged particle beam;
an aperture member, in which a plurality of openings are formed, configured to form multiple beams by letting a region including a whole of the plurality of openings be irradiated with the charged particle beam and letting parts of the charged particle beam respectively pass through a corresponding opening of the plurality of openings;
a plurality of first deflectors configured to respectively perform blanking deflection of a corresponding beam in the multiple beams having passed through the plurality of openings of the aperture member;
a second deflector configured to collectively deflect the multiple beams having passed through the plurality of openings of the aperture member so that the multiple beams do not reach the target object;
a blanking aperture member configured to block each beam that has been deflected to be in an off state by the plurality of first deflectors; and
a current detector, arranged at the blanking aperture member, configured to detect a current value of all beams in an on state in the multiple beams that have been deflected by the second deflector.

2. The apparatus according to claim 1, wherein the multiple beams are separated into a plurality of beam groups, each being per region of a plurality of regions which are obtained by dividing a multi-beam formation region,
further comprising:
a measurement unit configured to measure a current value of a beam group of each region of the plurality of beam groups by using the current detector;
a current distribution generation unit configured to generate a current distribution of the current value of the beam group of the each region; and
a judgment unit configured to judge whether a difference between a current distribution generated last time and the current distribution generated this time is within a tolerance range.

3. The apparatus according to claim 2 further comprising:
an all beam current measurement unit configured to measure an all beam current value of the multiple beams formed by respectively having passed through a corresponding opening of the plurality of openings of the aperture member.

4. The apparatus according to claim 3 further comprising:
an average current calculation unit configured to calculate an average current per beam by dividing the all beam current value by a number of beams.

5. A multi charged particle beam writing apparatus comprising:
a stage configured to mount a target object thereon and be movable continuously;
an emission unit configured to emit a charged particle beam;
an aperture member, in which a plurality of openings are formed, configured to form multiple beams by letting a region including a whole of the plurality of openings be irradiated with the charged particle beam and letting parts of the charged particle beam respectively pass through a corresponding opening of the plurality of openings;
a plurality of deflectors configured to respectively perform blanking deflection of a corresponding beam in the multiple beams having passed through the plurality of openings of the aperture member;
a blanking aperture member configured to block each beam that has been deflected to be in an off state by the plurality of deflectors; and
a current detector, movably arranged, configured to move in order to block all beams that are in an on state in the multiple beams so that the all beams do not reach the target object, and to detect a current value of the all beams in the on state.

6. The apparatus according to claim 5 wherein the multiple beams are separated into a plurality of beam groups, each being per region of a plurality of regions which are obtained by dividing a multi-beam formation region,
further comprising:
a measurement unit configured to measure a current value of a beam group of each region of the plurality of beam groups by using the current detector;
a current distribution generation unit configured to generate a current distribution of the current value of the beam group of the each region; and
a judgment unit configured to judge whether a difference between a current distribution generated last time and the current distribution generated this time is within a tolerance range.

7. The apparatus according to claim 6 further comprising:
an all beam current measurement unit configured to measure an all beam current value of the multiple beams formed by respectively having passed through a corresponding opening of the plurality of openings of the aperture member.

8. The apparatus according to claim 7 further comprising:
an average current calculation unit configured to calculate an average current per beam by dividing the all beam current value by a number of beams.

* * * * *